United States Patent [19]

Koizumi

[11] Patent Number: 5,203,399

[45] Date of Patent: Apr. 20, 1993

[54] HEAT TRANSFER APPARATUS

[75] Inventor: Hisao Koizumi, Zushi, Japan

[73] Assignee: Kabushiki Kaisha Toshiba, Kawasaki, Japan

[21] Appl. No.: 700,257

[22] Filed: May 15, 1991

[30] Foreign Application Priority Data

May 16, 1990 [JP] Japan .................. 2-124084

[51] Int. Cl.⁵ .................. F28D 15/02; H01L 23/427
[52] U.S. Cl. ............... 165/104.33; 165/104.22; 165/104.29; 361/385
[58] Field of Search ............ 165/104.22, 104.29, 165/104.24, 104.33; 361/385

[56]  References Cited

U.S. PATENT DOCUMENTS

| 4,552,208 | 11/1985 | Sorensen | 165/104.29 |
| 4,625,790 | 12/1986 | Okayasu | 165/104.29 |
| 4,818,845 | 4/1989 | Koizumi et al. | 219/314 |
| 4,959,526 | 9/1990 | Kurachi et al. | 219/314 |
| 5,006,689 | 4/1991 | Kurachi et al. | |

FOREIGN PATENT DOCUMENTS 63-318493 12/1988 Japan .

Primary Examiner—Albert W. Davis, Jr.
Attorney, Agent, or Firm—Oblon, Spivak, McClelland, Maier & Neustadt

[57] ABSTRACT

A cooling apparatus as one embodiment of a heat transfer apparatus of the present invention comprises a closing loop pipe line means enclosing a predetermined amount of liquid heating medium inside, a heat receiving section receiving heat from an object to be cooled, and transferring heat to said heating medium in said closing loop pipe means, a radiating section taking heat away from said heating medium in said closing loop pipe means, and one or more check values formed in said closing loop pipe line and allowing only one way flow of said heating medium from said heat receiving section to said radiating section direction. The present invention provides a heat transfer apparatus, which is represented by the above-mentioned cooling apparatus having a simple structure which does not need a circulation apparatus serving as a mechanical power source such as a pump.

5 Claims, 10 Drawing Sheets

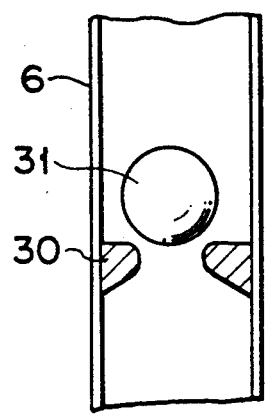
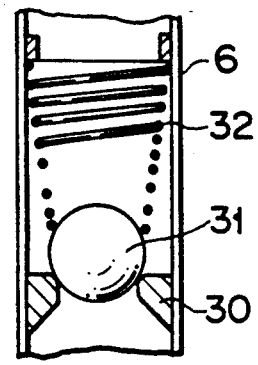
F I G. 9A   F I G. 9B
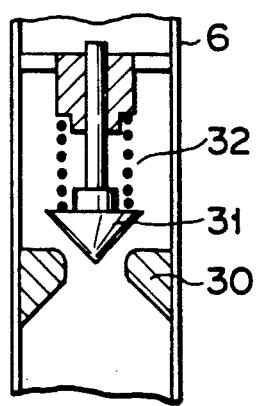
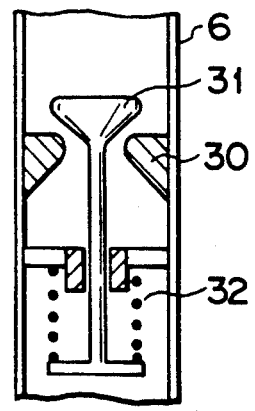
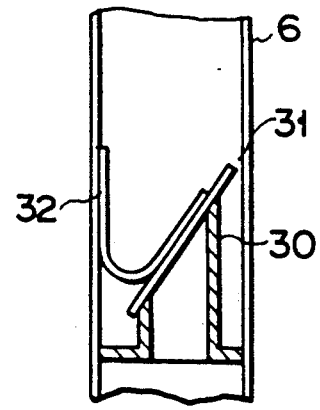
F I G. 9C   F I G. 9D   F I G. 9E

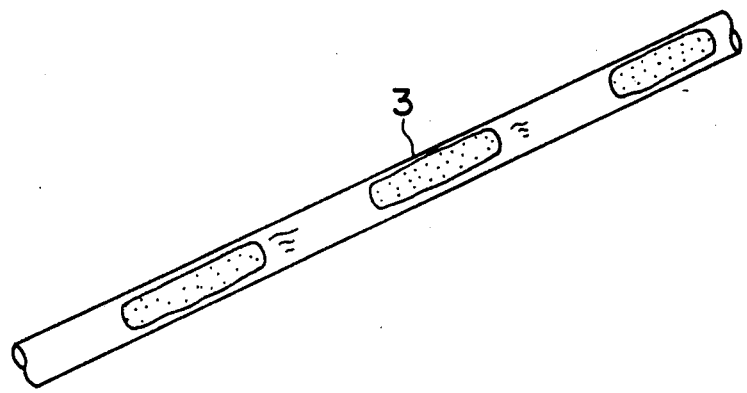
F I G. 12
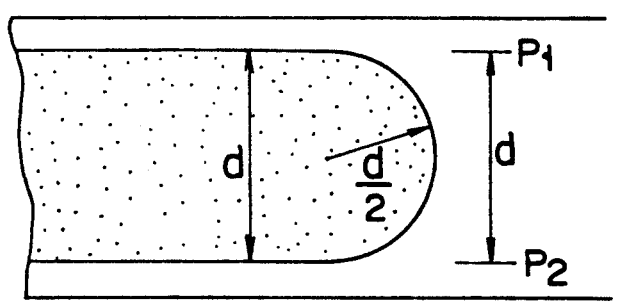
F I G. 13

HEAT TRANSFER APPARATUS

BACKGROUND OF THE INVENTION

1. Field of the Invention

The present invention relates to a heat transfer apparatus for circulating a liquid heat transfer medium by a heat function. The present invention transfers heat to cool various equipments, and provides a cooling apparatus which can control temperature.

2. Description of the Related Art

The details of the related art can be seen in the following U.S. Patents:

(1) U.S. Pat. No. 4,818,845
(2) U.S. Pat. No. 4,959,526
(3) U.S. Pat. No. 5,006,689

In a heat transfer apparatus for cooling, heating, and air conditioning, heat transfer utilizing natural circulation has been widely used. However, in actual use, such systems have not been effective in situations other than where heat density and transfer density requirements are low.

There is a heatpipe shown in FIG. 14 as a heat transfer apparatus by use of the heat function having high heating density, which has been recently studied and developed.

In this apparatus, a heating medium 100 is enclosed in an enclosing pipe line 101. If the heating medium 100 evaporates in a heat receiving section 102 of the heat carrier heating medium and changes to gas, and flows into a radiating section 103, gas condenses and liquefies, and returns to the receiving section 102 again by the gravitational effect. This circulation force is a system using gravity. In this system, as shown in FIG. 14, the radiating section 103 is arranged at the section which is higher than the position of the heat receiving section 102, and the arrangement in the course of the pipe line is limited so that flow using gravity can be maintained.

In a system using no gravity, since the circulation depends on a delicate force, which is based on "wetting action (a kind of a capillary phenomenon" of a maintaining material, which is called "wick", circulation force of the heating medium is restricted. Therefore, the heatpipe has been used only limitedly, and a pump is generally used for the circulation of the heating medium. However, the forced circulation apparatus such as a pump is large-scale and the structure is complicated. For this reason, there has been greatly desired a heating medium circulation system wherein a movable section such as a pump and the like is not attached, the structure is simple, reliance is high, manufacturing cost is low, and the condition of use is not limited.

Particularly, in recent years, power semiconductor elements and a power control system using such elements have been frequently used in the semiconductor as used in, for example, an inverter air-conditioner, and the like as a semiconductor electric circuits is miniaturized and its high density is improved. For this reason, it can be considered that a semiconductor control circuit having high heating density will be increasingly used.

Conventionally, in order to cool the circuit elements and substrates, natural draft or forced draft, i.e., fan cooling is generally used. Moreover, the above-mentioned heatpipe or a water cooling type cooling apparatus is used as heating density of a heating source is increased. However, since such a heatpipe has the above-mentioned limitation and the water cooling type needs a water circulation apparatus such as a separate pump, this type is applied to only the large-scale apparatus.

As mentioned above, the cooling apparatus as an example of the heat transfer apparatus is applied to only the apparatus having a low heat transfer density in the heatpipe using natural circulation and no gravity. On the other hand, regarding the heatpipe using gravity, the arrangements (positions) of the structural parts (heat receiving section, radiating section, and the like) are limited. Moreover, there has been a disadvantage in that the apparatus using the forced circulation apparatus such as a pump became large-scale itself.

Summary of the Invention

An object of the present invention is to provide a cooling apparatus wherein heat transfer density is high, the arrangement of each structural part is not limited, and its structure is simple without using a circulation apparatus serving as a mechanical power source such as a pump, and a temperature control apparatus using the cooling apparatus.

In order to attain the above object, the present invention will be featured by the following plural embodiments.

A cooling apparatus as a first embodiment comprises the following element described below.

Specifically, the cooling apparatus of the first embodiment comprises a closing loop pipe line wherein a predetermined amount of liquid heating medium is enclosed inside; a heat receiving section, which receives heat from a material to be cooled and transfers heat to the heating medium in the closing loop pipe line; a radiating section, which takes heat away from the heating medium in the closing loop pipe line; and a check valve, which is formed in the closing loop pipe line, and allows the heating medium to flow in only one direction, which is from the heat receiving section to the radiating section.

The cooling apparatus of the second embodiment comprises a closing loop pipe line wherein a predetermined amount of liquid heating medium is enclosed inside; a heat receiving section, which receives heat from a material to be cooled and transfers heat to the heating medium in the closing loop pipe line; a radiating section, which takes heat away from the heating medium in the closing loop pipe line; a first check valve, which is formed to move the heating medium in a first direction, which is toward the radiating section, by a volume expansion generated when at least one part of the heating medium evaporates; and a second check valve, which is formed to move the heating medium in the same direction as the first direction by a volume contraction generated when the heating medium evaporated in the radiating section is cooled.

The cooling apparatus of the third embodiment comprises a closing loop pipe line wherein a predetermined amount of liquid heating medium is enclosed inside, a heat receiving section, which receives heat from a material to be cooled and transfers the heat to the heating medium in the closing loop pipe line; a first radiating section, which takes the heat away from the heating medium in the closing loop pipe line; a second radiating section, which takes the heat away from the heating medium by heat-exchanging the heating medium cooled in the first radiating section for the heating medium heated in the heat receiving section; a first check valve, which is formed between the first and the second radiating sections and allows the heating medium to flow in only one direction, which is from the heat receiving section and the second radiating section to the radiating section; and a second check valve, which is formed between the second radiating section and the receiving section and allows the flow of the heating medium in the same direction as that of the first check valve.

Moreover, another embodiment of the heat transfer apparatus of the present invention which is applied to the above-mentioned cooling apparatus comprises the following elements.

Specifically, the cooling apparatus of this embodiment comprises a closing loop pipe line wherein a predetermined amount of liquid heating medium is enclosed inside; a heat receiving section, which receives heat from a material to be cooled and transfers heat to the heating medium in the closing loop pipe line; a radiating section, which takes heat away from the heating medium in the closing loop pipe line; first and second check valves, which are formed in the closing loop pipe line, and allow the heating medium to flow in only one direction, which is from the heat receiving section to the radiating section; and a pressure control section, which controls pressure in the closing loop pipe line.

According to the above-structured present invention, in the cooling apparatus of the first embodiment, volume expansion energy wherein volume considerably expands when the heating medium evaporates in the heat receiving section can be effectively converted to a circulation force by use of the check valve. For this reason, the heating medium, which takes heat away from the equipment to be cooled, circulates to the radiating section, so that the equipment can be cooled. Since the volume expansion energy is relatively large, the heating medium can circulate even against gravity. Therefore, the arrangement of piping is not limited and the cooling apparatus with a simple structure, which is one example of the heat transfer apparatus, can be realized.

Moreover, if the heating value of the equipment to be cooled is large, generation of boiling bubbles is promoted, and the heat circulation effect is strong. If the heating value is small, the generation of boiling bubbles is controlled and the heat circulation effect weakens.

In other words, it can be said that the cooling apparatus as one example of the heat transfer apparatus of the present invention has a temperature self-control function. More specifically, when the heating value is large, a cooling function automatically strengthens without any control from the external section, and when the heating value is small the cooling function automatically weakens without any control from the external section. Therefore, the temperature of the equipment to be cooled can be controlled to be constant to some extent.

In the cooling apparatus of the second embodiment, the following technical advantage can be obtained in addition to the technical advantage of the cooling apparatus of the first embodiment.

Specifically, in this embodiment, two check valves are provided, thereby one of the check valves effectively converts the volume expansion energy of the heating medium to circulation force of the heating medium similar to the first cooling apparatus. Also, the other check valve effectively converts the volume contraction energy, which is generated when the evaporated heating medium is cooled in the radiating section, to a circulation force of the heating medium. Therefore, since the circulation force increased, the operation of the apparatus can be stabilized, so that the cooling apparatus of this embodiment is further improved than that of the first embodiment in terms of the cooling function.

In the cooling apparatus of the third embodiment, the following technical advantage can be obtained in addition to the technical advantages of the cooling apparatuses of the first and second embodiments.

Specifically, the cooling apparatus of the third embodiment enlarges the cooling effect of the heating medium and increases the volume contraction energy, so that the circulation force is improved. In other words, in order to exchange heat between the heating medium cooled to below a saturation temperature in the first radiating section and the heating medium with which vapor to be volume-contracted is mixed, vapor contracts very rapidly, so that the circulation force increases and the operation of the apparatus can be stabilized. As a result, the cooling apparatus of this embodiment is further improved than the apparatuses of the first, and second embodiments in terms of the cooling function.

According to the heat transfer apparatus of the present invention as one of temperature control apparatuses, since the cooling force in the cooling apparatus of the first embodiment can be freely controlled, the temperature of the main unit to be attached can be arbitrarily controlled.

In other words, pressure in the closing loop pipe line is arbitrarily controlled, thereby making it possible to freely control an evaporation temperature of the heating medium (boiling point). Thus, the temperature of the apparatus to be temperature-controlled can be freely controlled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A to FIG. 9E are schematic views showing cross sectional views of a check valve which can be applied to the heat transfer apparatus as in the cooling apparatus of the present invention and the temperature control apparatus;

FIG. 12 is a model view showing a piston flow type of the heating medium in the pipe line relating to the present invention;

FIG. 13 is a principle view for obtaining conditions of the thickness of a horizontal pipe relating to the present invention.

DETAILED DESCRIPTION OF THE PREFERRED EMBODIMENTS

First Embodiment

Figure 1:
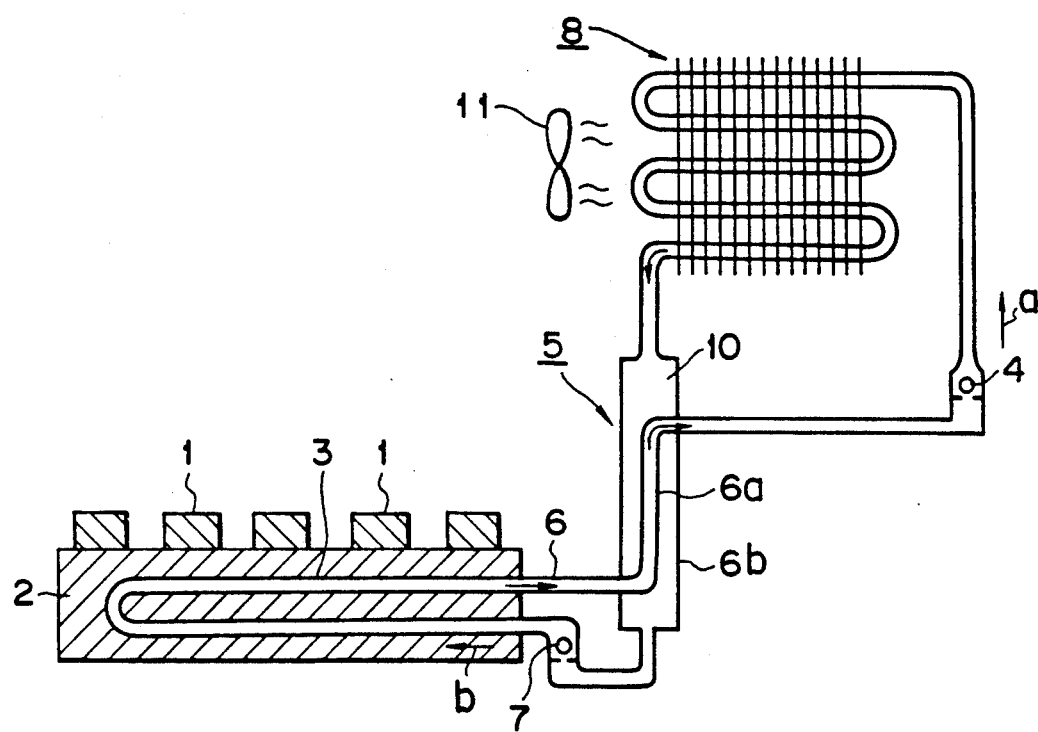
FIG. 1 is a schematic view showing one embodiment of a cooling apparatus of the present invention.

FIG. 1 is a first embodiment of a cooling apparatus as one example of the heat transfer apparatuses of the present invention. In this apparatus, there are mounted a plurality of units 1 to be cooled such as high heating semiconductor parts in a state that they contact a cooling plate 2 made of a good heat conductive material such as copper. In the inside of the cooling plate 2, a part of a heating medium pipe 6 is inserted and functions as a heat receiving section 3 of the cooling plate 2. In the extended portion of the heating medium pipe 6, there is provided a radiator 8 serving as a first radiating section. The radiator 8 emits heat into air from the heating medium by blowing air by use of a fan 11. Check valves 4 and 7, which control the flow of the heating medium, are attached to two portions of the extended portion of the heating medium pipe 6 inserted into the cooling plate 2. These check valves 4 and 7 allow the flow of the heating medium in only the directions of arrows a and b. Reference numeral 5 is an inter liquid heat exchanger, which serves as a second radiating section, and is formed to be a double pipe structure. The heating medium heated in the heat receiving section 3 flows into an inner pipe 6a of the double-pipe structure. Moreover, the whole loop piping, which comprises the heating medium pipe 6 and an outer tube 6b of the inner pipe 6a, and the external portion are sealed off, and the following heating medium 10, for example, is enclosed in the pipe line.

Specifically, the heating medium may be selected from among organic heating mediums such as water, methyl alcohol, ethyl alcohol, various Freon, and butane and other kinds of heating mediums such as fluoroolefin.

The amount of liquid of the heating medium to be enclosed is generally about 20 to 99% of the whole loop deposition, preferably 70 to 95% of the whole loop deposition. Under a equilibrium condition in the pipe line, the amount of liquid stops in a state that vapor and liquid coexist under a saturated pressure or a saturation temperature.

If a heating phenomenon occurs during the start of the operation of the unit 1 to be cooled, a cooling fan 11, which sends a blast to the radiator 8, with starts operating. Then, heat of the unit 1 to be cooled is transferred to the cooling plate 2, and further transferred to the heating medium 10 in the heating medium pipe of the heat receiving section 3. As a result, as the temperature of the heating medium 10 rises, boiling bubbles are generated, and vapor function is started to be frequently performed. In accordance with the vapor of the heating medium, the volume of the heating medium 10 expands, so that the check valve 4 opens and the heating medium 10 moves in the direction of an arrow a. Sequentially, boiling bubbles move along the pipe, and reach to the vicinity of the inter liquid heat exchanger 5. Then, the boiling bubble heat-exchanges for the heating medium cooled by the radiator 8, so that the boiling bubbles are cooled and condensed. The volume contracts and the check valve 4 closes and the other check valve 7 opens. As a result, the heating medium 10 moves in an direction of an arrow b which is the same as the direction of the arrow a in the loop. In actuality, the vapor of the heat receiving section and the condensation of the inter liquid heat exchanger occur at the same time. However, the vapor is superior to the condensation for a certain instant, and the volume expansion occurs. Then, for the next instant, the condensation is superior to the vapor, and the contraction occurs. As mentioned above, the volume is changed, and the check valves 4 and 7 opens and closes in accordance with the change, and the heating medium is moved in the direction of the arrow.

As mentioned above, in the heating medium pipe 6, which is the so-called closing loop pipe line, one way flow of the heating medium 10 occurs. The relatively cooled heating medium 10 is supplied to the outer pipe 6b of the heat exchanger 5, so that the radiator 8 improves the heat-exchange efficiency between the inner pipe 6a and the outer pipe 6b.

As mentioned above, the principle of the present invention is that heat energy is effectively converted to circulation force in the closing pipe by use of the radiating section and a pair of the check valves. The conditions for efficiently driving the heating medium in one direction in the closing loop piping will be explained as follows:

If the heating medium 10 receives heat in the heat receiving section 3, the temperature rises, and the temperature reaches the saturation temperature, vapors are generated and changed to be in two phase state. The liquid in the case of the so-called "two phase flow" can be changed to the various states as shown in FIGS. 10(a) to 10(g) and FIGS. 11(a) to 11(h). However, in a case where the state of flows such as "plug flow", "slag flow", "floss flow" is under a condition where the state becomes the so-called "piston flow" as shown in FIG. 12, the flow is limited to one direction by two check valves 4 and 7 if vapor advances and bubble grows. Due to this, the liquid is well driven (flows) in one direction. In a case of a laminar flow, even if the amount of vapor increases, the liquid is not always moved, and only vapor may flow.

Figure 11:
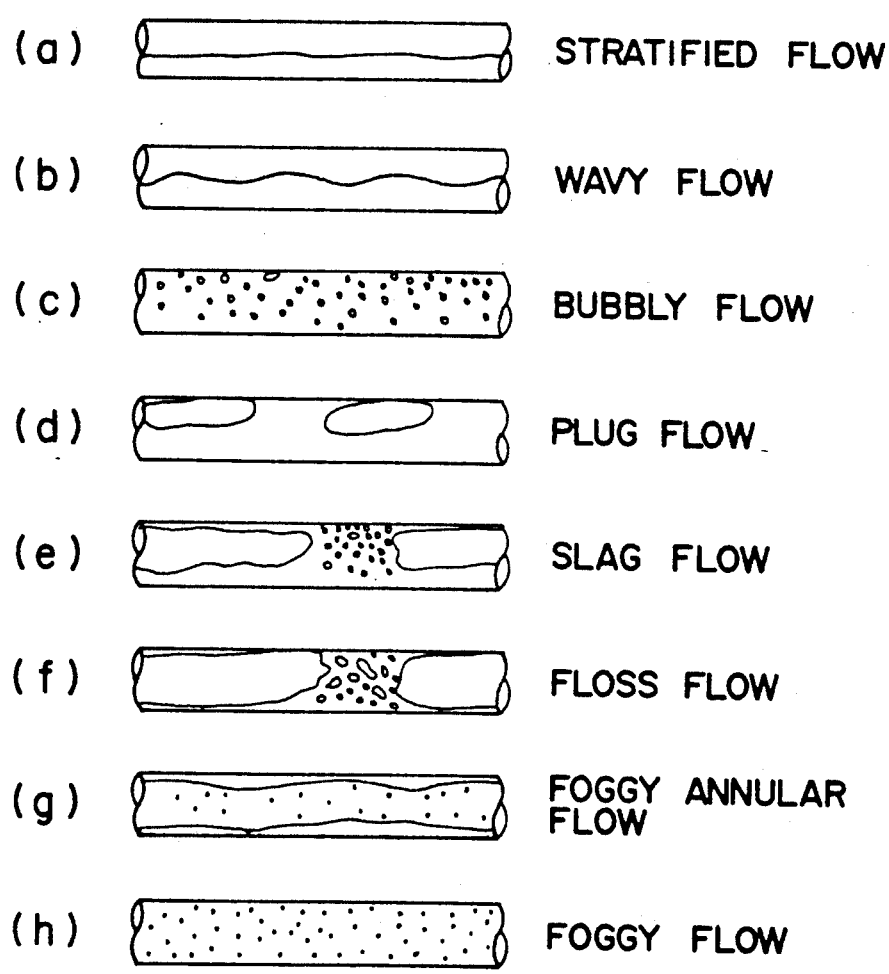
Figure 14:
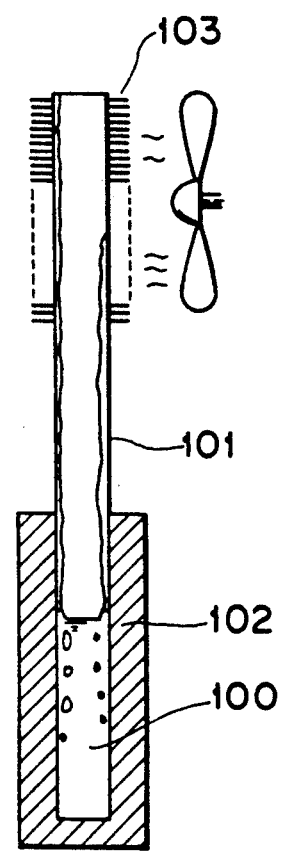
FIG. 14 is a schematic view showing briefly one example of the conventional cooling apparatus.

If the conditions for the above-mentioned piston flow are considered, the conditions can be analyzed as follows:

In a case of a horizontal pipe, in order to maintain force, which tends to separate vapor-liquid like a laminar flow of FIG. 11(a) up and down due to influence of gravity, to be the piston flow having a small interface by surface tension of gas-liquid boundary surface, the following three conditions can be listed.

(1) Pipes should be of a smaller diameter than a predetermined condition;

(2) Avoid excessive boiling; and (3) Flow speed should be slow to some extent.

FIG. 13 illustrates a competitive action between force, tends to be a laminar flow of FIG. 11(a) by gravity, and force, which maintain the flow to be a piston flow type by surface tension in the case of the horizontal pipe. The pipe shown in FIG. 13 is a horizontal circular pipe, and the gas-liquid boundary surface in the piston flow state is shown in this drawing.

In the drawing, the pressure difference generated by gravity of points P1 and P2 can be calculated by the following equation:

$$\Delta P = P2 - P1 = \rho g d$$

wherein $\rho$: liquid density [kg/m$^3$], g: gravitational acceleration [m/s$^2$], $\Delta P$: different pressure [Pa=N/m$^2$], and d: diameter of pipe [m].

Also, rising pressure P$\sigma$ due to surface tension of the pressure in bubble can be obtained by the following equation:

$$P\sigma \times \pi d^2/4 = \sigma \pi d \quad P\sigma = 4\sigma/d$$

wherein $\sigma$: surface tension [N/m], and P$\sigma$: rising pressure due to surface tension [N/cm$^2$].

In a case where P$\sigma$ is larger than $\Delta P$, since the pattern of the piston flow is not considered to be deformed by gravity, the following relationship can be obtained:

$$P\sigma > \Delta P \rightarrow 4$$
$$\sigma/d > \rho g d \rightarrow d^2 < 4\sigma/\rho g \rightarrow d < 2\sqrt{\sigma/\rho g} \quad (1)$$

In other words, if the diameter of the pipe is smaller than $2\sqrt{\sigma/\rho g}$, the piston type bubble of FIG. 12 is not changed to a laminar shape shown in FIG. 11(a) by gravity.

Moreover, since it is considered that the piston type bubble is much difficult to be deformed in a case of a vertical pipe and an inclined arrangement, the above equation (1) can be generally established. Furthermore, in a case where gravity is smaller than the equation (1), for example, in a space satellite, it is shown that the piston type bubble can be maintained by even a larger diameter pipe.

This units [m] and [Kg/m$^3$] in above equation (1) are also changed to [mm] and [g/cm$^3$]. Using the fixed value g=10 [m sec$^2$]. above equation (1) is equal to the following equation (2).

$$d < 20\sqrt{\sigma/\rho} \quad (2)$$

The pipe is not always positioned holizontal, but slant or vertical as well.

The surface tension is not stable because of many changeable factors. Above equations (1) and (2) give us some example diameter of the pipe.

According to the inventor's experiment, it is confirmed that the present apparatus can be used normally within the limits represented a following equation (3).

$$d < 150\sqrt{\sigma/\rho} \quad (3)$$

As mentioned above, if vapor is generated and evaporation continues, bubble enlarges, and the volume expands, the check valve 4 opens and the check valve 7 closes. Due to this, liquid and bubble are pressed and flow in the one direction. If a bubble flows into the inter liquid heat exchanger 5, the bubble condenses by heat-exchanging for the heating medium 10 cooled in the radiating section 8, and the volume starts to be reduced. Thereafter, since the check valve 7 in front of the heat receiving section 3 opens, and the check valve 4 closes, heating medium liquid returned from the radiating section 8 is introduced to the heat receiving section 8. Thereafter, the heat receiving section 3 is cooled, and evaporation is pressed and the contraction of the volume is further promoted. If the condensation of the bubble advances and the volume sufficiently reduces, the flow of the heating medium 10 to the heat receiving section 3 is stopped, the temperature of the heat receiving section 3 rises again, and the cycle of evaporation, enlarging bubble, and volume expansion is repeated. By repeating this cycle, the pump function continues, and the heating medium is circulated from the heat receiving section 3 to the radiating section 8 or from the radiating section 8 to the heat receiving section 3, thereby the function as the cooling system of the above-mentioned apparatus is performed.

In such a heating medium circulation function, if the heat value of the unit 1 to be cooled increases, the generation of boiling bubbles is promoted and the cooling function strongly works. If the heat value of the unit 1 to be cooled decreases, the generation of boiling bubbles is controlled and the cooling function weakens.

In other words, it can be said that the cooling apparatus of the present invention has the so-called "temperature self-control function." More specifically, when the heating value is large, the cooling function automatically strengthens without any control from the external section, and when the heating value is small, the cooling function automatically weakens without any control from the external section. Therefore, the cooling apparatus of the present invention can control the temperature of the unit 1 to be cooled to some extent of the predetermined value. It can be said that such a temperature self-control function should be a noticeable function.

The following explains the numerical values showing the diameters of the pipes in the vicinity of the heating receiving section 3 of the heating medium pipe 6 calculated by the above equation (1) in order to efficiently obtain the heating medium circulation function. In this case, the diameters of these pipes are values in a case in which the heating medium pipe 6 is horizontally arranged, and suitable values for improving the circulation efficiency of the apparatus to the maximum. The present invention is not limited to this condition.

TABLE 1

| Heating Medium | Water | Freon 113 | Ethyl alcohol |
|---|---|---|---|
| Surface Tension [mN] | approx. 70 (40° C.) | approx. 15 (40° C.) | approx. 20 (40° C.) |
| Density [kg/m$^2$] | 1000 | 1500 | 770 |
| $d < 2\sqrt{\sigma/\rho g}$ [m] | $d < 5.34 \times 10^{-3}$ | $d < 2.0 \times 10^{-3}$ | $d < 3.25 \times 10^{-3}$ |

As shown in Table 1, the diameter of the heating medium pipe 6 (diameter of pipe) in the vicinity of the heat receiving section 3 is preferably 5.34 mm or less if the heating medium is water, preferably 2.0 mm or less if the heating medium is Freon 113, and preferably 3.25 mm or less if the heating medium is ethyl alcohol.

As mentioned above, the diameters of these pipes are values in order to obtain circulation force having the best efficiency in the horizontal pipe. Even if the thickness of the pipe in the vertical pipe and the inclined arrangement is larger than the above values, the circulation force having good efficiency can be obtained. Therefore, the present invention is not limited to the above values.

Moreover, in an agravity state such as a space satellite, since a gravitational acceleration $g=0$, $d < \infty$ can be obtained from the equation (1) and the thickness of the pipe is not fixed. However, even if the diameter of the pipe is thick in the agravity state, it can be understood that the piston type bubble can be easily maintained.

Second Embodiment

Figure 2:
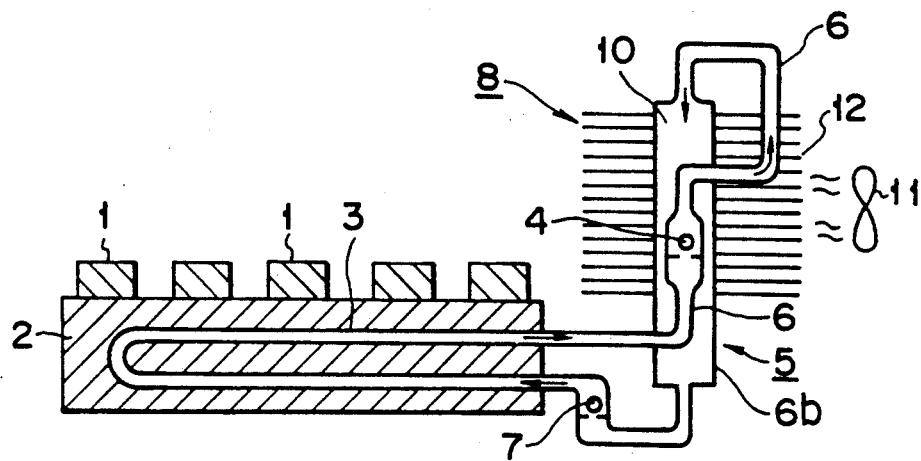
FIG. 2 to FIG. 4 are schematic views showing other embodiments of the cooling apparatus of the present invention.
Figure 3:
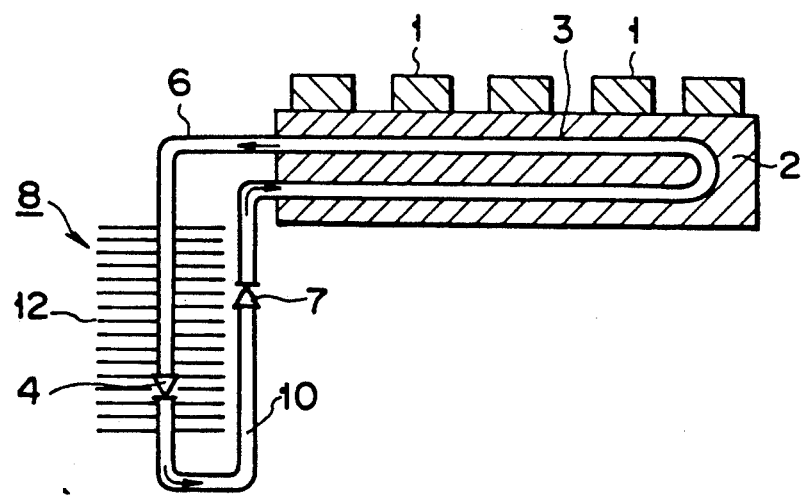

FIG. 2 and FIG. 3 show views relating to the cooling apparatus, which is one of examples of the heat transfer apparatus of the present invention.

In the first embodiment shown in FIG. 1, the radiator 8 serving as the first radiating section and the inter liquid heat exchanger 5 serving as the second radiating section are separated and the check valve 7 is provided therebetween. In the apparatus shown in FIG. 2, the radiator 8 and the inter liquid heat exchanger 5 are integrally formed as a radiating section 12.

FIG. 3 shows the structure wherein the inter liquid heat exchanger 5 and the cooling fan 11 are omitted and the heating medium 10 is cooled by only the radiating section 12 such as a radiating fin. In this case, the radiating section 12 may be structured to be mounted on the outside position which is suitable for radiation.

In the above two embodiments, the check valve 7 is provided in the course of the radiating section 12. This is because the check valve 7 is mounted on the suitable position to effectively obtain one circulation force of the heating medium 10 by the expansion of the heating medium 10 and the condensation thereof.

As mentioned above, the simplest structure of the cooling apparatus relating to the present invention comprises the heat receiving section 3, the radiating section 12, the first check valve 4 provided in the course of the radiating section 12, and the second check valve 7 provided in front the flowing direction of the heat receiving section 3.

Particularly, the unit to be cooled is not always attached to the cooling plate 2. In a case where no cooling plate 2 is provided, the heating medium pipe 6 is directly attached to the pipe wall.

Third Embodiment

Figure 4:
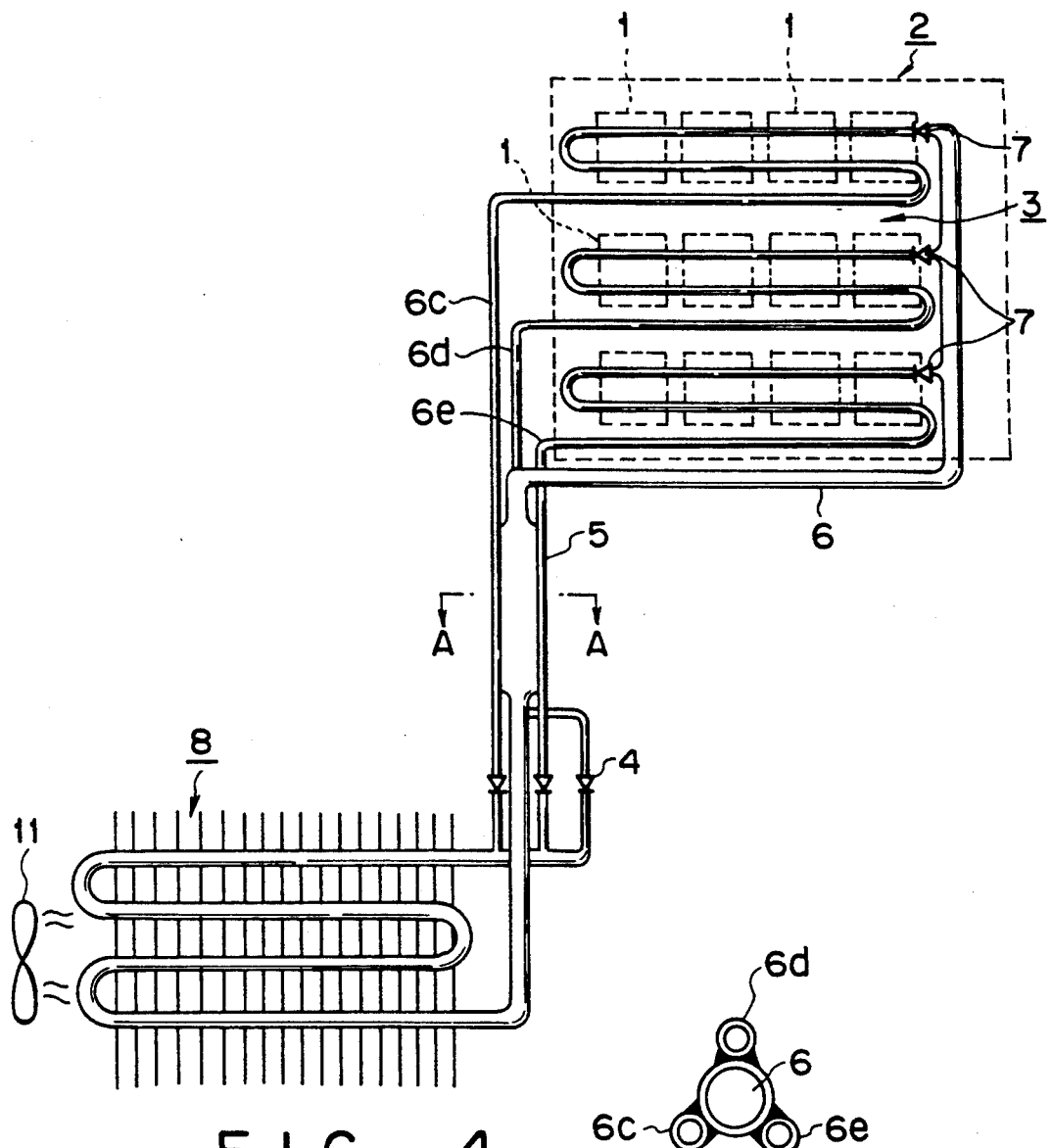

FIG. 4 is a view showing the third embodiment of the cooling apparatus, which is one example of the heat transfer apparatus of the present invention.

In this embodiment, the heating medium pipe 6, which is close to the heat receiving section 3, is branched into two heating medium pipes 6c, 6d, and 6e as a parallel line to surely obtain sufficient amount of flow in the vicinity of the heat receiving section 3.

If the heating density of the unit (heater element) to be cooled increases extremely high in accordance with the high density mounting of the heater element (i.e., semiconductor), the diameter of the heating medium pipe 6, which is closed to the heat receiving section 3, is limited from the equation (3) to obtain the heating medium circulation force having good efficiency, and cooling ability may not be sufficiently increased by only one pipe. This embodiment explains an invention to deal with the above-mentioned problem. Specifically, the heating medium pipe 6, which is close to the heat receiving section 3, is branched into a plurality of the parallel pipes. Then, since the thicknesses of these heating medium pipes 6, which are other than the vicinity of the heat receiving section 3, are not limited, they are structured to be merge with to the thicker portions of the heating medium pipes 6.

Figure 5A:
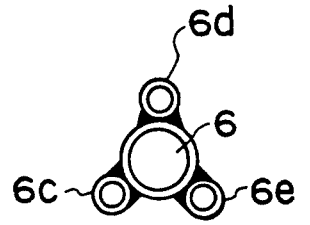
FIG. 5A and FIG. 5B are cross sectional views of two embodiments taken along the line A—A of FIG. 2.

In FIG. 4, "a plural pipe heat contact system", which is different from the above-mentioned "double pipe system" as an inter liquid heat exchanger 5, is used. FIG. 5(A) shows a cross sectional view taken along line A—A of the heat exchanger 5. As shown in FIG. 5(A), the heating medium pipes 6c, 6d, and 6e, which took heat away from the heat receiving section 3, are in contact with the heating medium pipe 6, in which the cooled heating medium 10 flows, by soldering to easily transfer heat sufficiently. Thereby, heat exchanging is performed well.

Figure 5B:
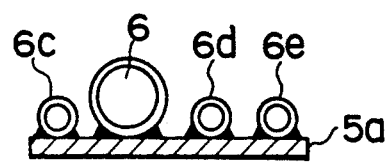

Moreover, as shown in FIG. 5(B), the heating medium pipe 6 and pipes 6c, 6d and 6e are respectively in contact with the heat exchanger 5, which is the good conductive member, by soldering, and heat exchanging may be formed through a heat exchanging plate 5a.

Furthermore, as shown in FIG. 4, in the structure wherein the heating medium pipe 6 is branched into the plurality of pipes in parallel, if the pipes are merged with each other at the back and forth positions of the heat exchanger 5, it is possible to use the heat exchanger of the above-mentioned double pipe system.

Additionally, the plurality of the parallel pipes can obtain sufficient amount of flow by suitably adjusting the branched portions as required. Also, this piping is well shaped.

Fourth Embodiment

Figure 6:
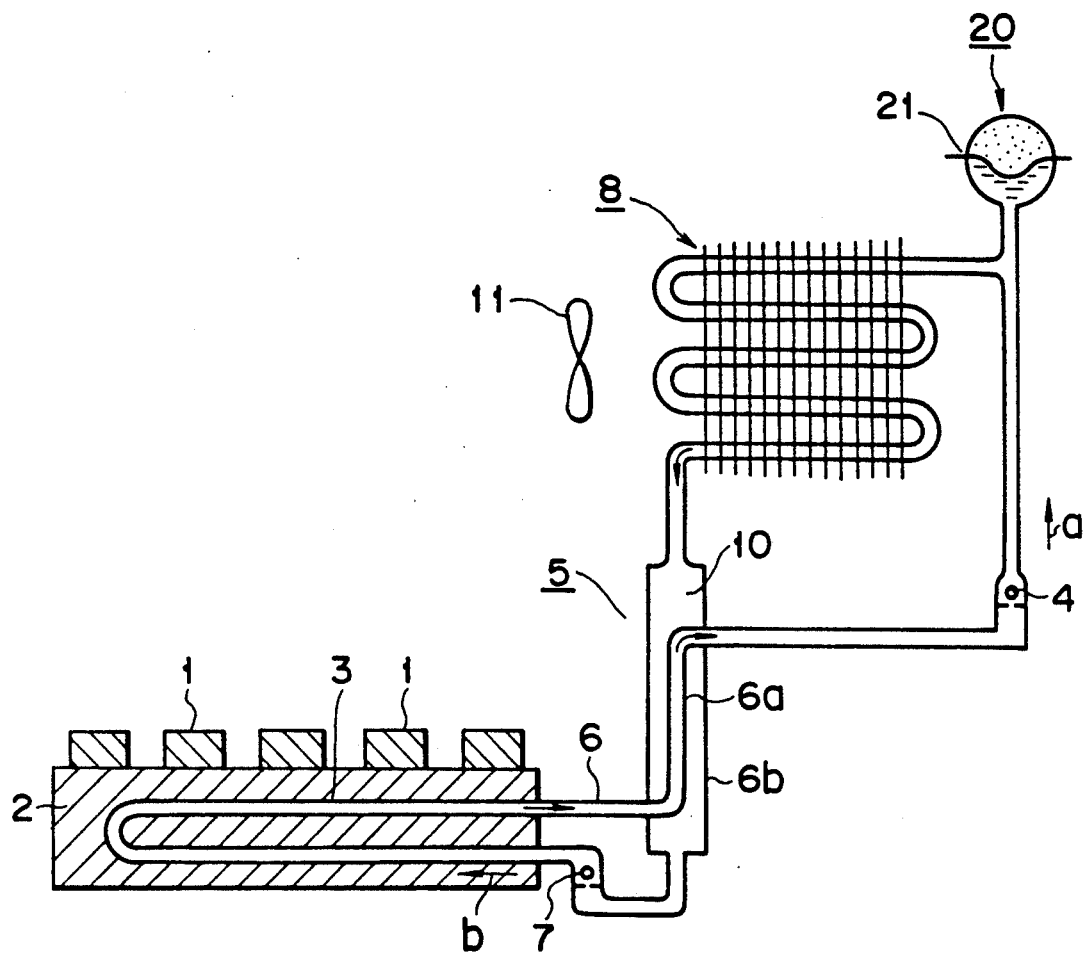
FIG. 6 is a schematic view showing other embodiment of the cooling apparatus of the present invention.

FIG. 6 is a view showing the fourth embodiment of the cooling apparatus, which is another example of the heat transfer apparatus of the present invention.

This embodiment shows one example of the cooling apparatuses in which a volume change absorbing apparatus 20 is provided to stabilize the operation of the heating medium. In the volume change absorbing apparatus 20, non-condensable gas, which does not condense in a normal state, (this case is not limited to limited to nitrogen gas), is enclosed in an upper space, which is divided by a rubber diaphragm 21. The lower space is connected to the heating medium pipe 6 and is filled with the heating medium 10.

In the cooling apparatus having the volume change absorbing apparatus 20, the operation is stabilized as follows:

Specifically, the closing pipe line (heating medium pipe 6), if the heating medium 10 receives heat from the heat receiving section 3 and a boiling bubble is generated, pressure in the closing loop pipe line rises. If the pressure becomes higher, the evaporation temperature (boiling point) increases, so that the operation may be unstable. Therefore, the change of pressure in the closing loop pipe line, which occurs by the evaporation of the heating medium 10 and the condensation, is absorbed by the volume change absorbing apparatus 20. Thereby, the pressure in the closing loop pipe line is controlled to be maintain substantially constantly. If the change of pressure in the closing loop pipe line is small, the evaporation temperature of the heating medium 10 is maintained substantially constantly. Thereby, the operation of the cooling apparatus is extremely stabilized.

Moreover, as mentioned above, the cooling apparatus has the temperature self-control function. However, if the pressure in the closing loop pipe line is maintain substantially constantly, the evaporation temperature of the heating medium 10 is constantly maintained and the cooling temperature of the unit to be cooled can be stably maintained.

Fifth Embodiment

The following explains a temperature control apparatus as other embodiment of the heat transfer apparatus of the present invention.

Figure 7:
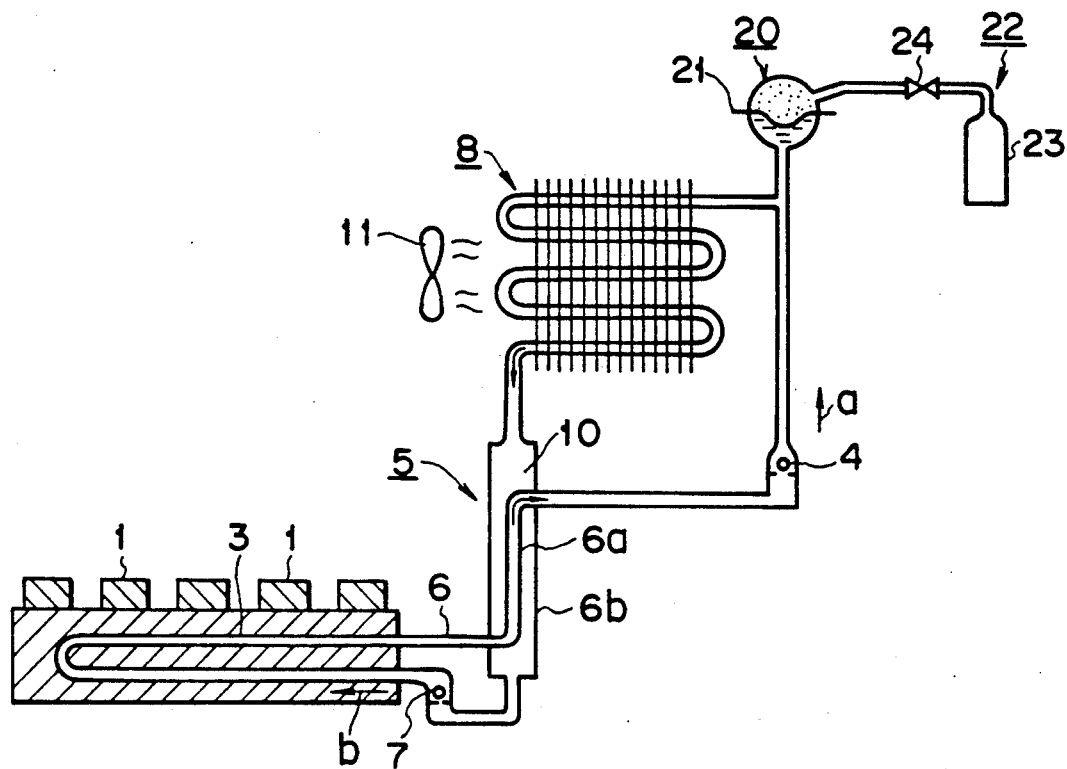
FIG. 7 is a schematic view showing one embodiment of the cooling apparatus having a temperature control apparatus.

FIG. 7 shows a basic structure of the apparatus, and a small-size bomb 23 as a pressure controlling apparatus and a pressure reducing valve 24 are added to make it possible to control gas pressure of non-condensable gas, which is enclosed in the upper space divided by the rubber diaphragm 21 of the volume change absorbing apparatus 20 shown in FIG. 6. In the temperature control apparatus, high pressure gas in the bomb 23 is controlled by the pressure reducing valve 24, and the entire pressure in the volume change absorbing apparatus 20 and the closing loop pipe line (heating medium pipe 6) can be controlled to maintain a predetermined pressure. By use of the pressure control apparatus 22, the pressure in the closing loop pipe line is arbitrarily changed, so that the evaporation temperature of the heating medium 10 is changed, and the cooling efficiency is controlled. As a result, the temperature of the unit 1 to be cooled can be suitably controlled.

Figure 8:
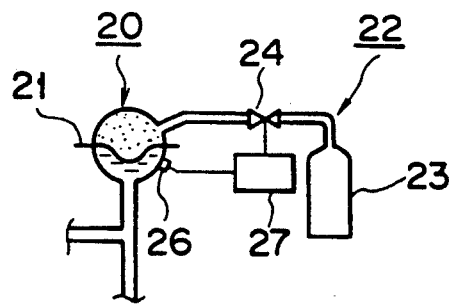
FIG. 8 is a schematic view of the other embodiment showing a part of the temperature control apparatus provided in the cooling apparatus of FIG. 7.
Figure 10:
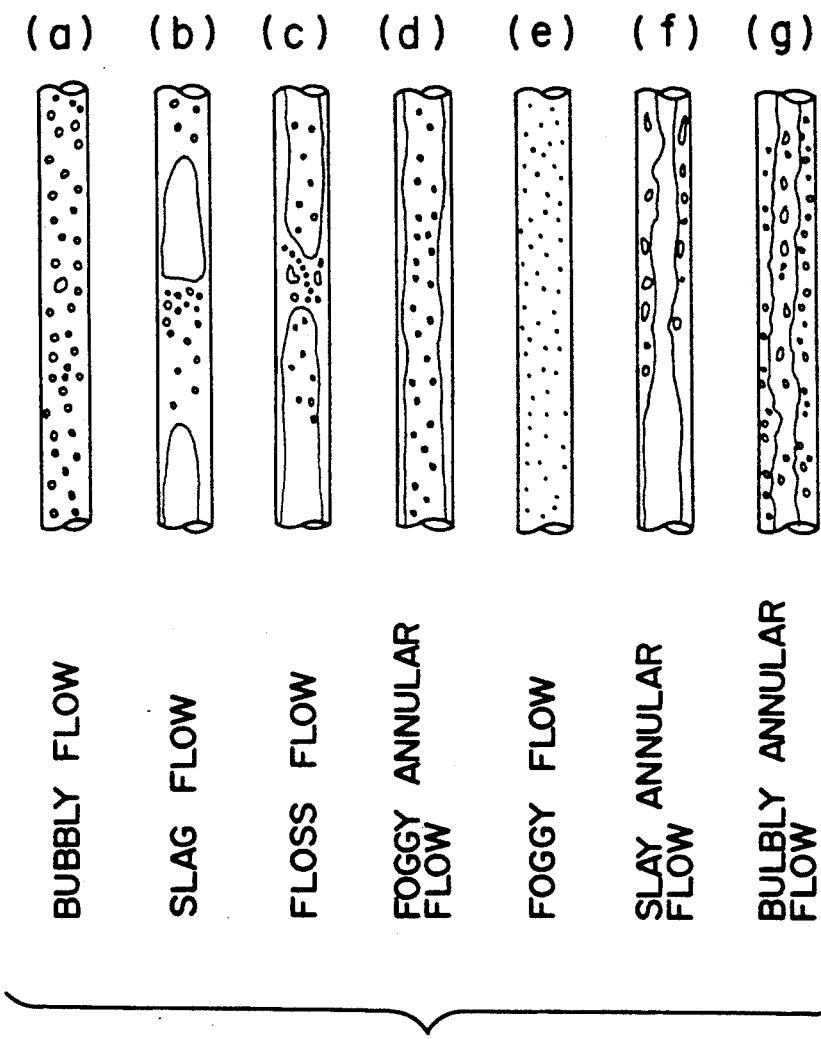
FIGS. 10 and 11 are schematic views showing various flowing type of the heating medium in the various pipe lines.

Also, in order to automatically control the temperature of the unit 1, as shown in FIG. 8, the temperature of the heating medium 10 (or unit 1) is detected by a pressure sensor 26, and the opening of the pressure reducing valve 24 may be automatically controlled by a valve opening control apparatus 27.

The cooling apparatus originally has some temperature self-control function. As explained in the above embodiment, the pressure control apparatus 22 is provided, so that the range of the temperature control can be widely set and controlled. This is a very effective mechanism.

Additionally, in the apparatus having a plurality of pipes in the heat receiving section as shown in the third embodiment, the evaporation values in the respective positions of the pipes in the heat receiving section can be changed to be canceled each other without providing the volume change absorbing apparatus 20 as explained in the fourth and the fifth embodiments. Thereby, it is featured that the stable operation can be performed. In view of the point that the structure of the apparatus becomes simple, the parallel piping system explained in the third embodiment is extremely effective.

FIG. 9A to FIG. 9E are cross sectional views showing a plurality of examples of the check valve. FIG. 9A is a view showing a check valve with the simplest structure. The check valve comprises a seat valve 30 formed in the heating medium pipe 6, and a ball as a valve body 31. As a ball, there are used various kinds of metals such as a steel ball, an alloy, or various kinds of resin such as heat-resisting plastic. Since this type of the check valve is structured in a state that the valve body (ball) 31 is free, the use of this type of the check valve is limited to some extent.

In FIGS. 9B to 9E, Even if the check valve having a compression spring 32, which compresses the valve body 31 to the valve seat 30, is used in an agravity state or a horizontal pipe, the check valve can be used without any problems.

The shapes of the above check valves are not limited to the examples of the above figures, and any shapes may be used if the functions are equal. Regarding the amount of the heating medium 10, it was explained previously the amount of the heating medium is generally about 20 to 99% of the whole loop deposition, preferably 70 to 95% of the whole loop deposition. These percentages are values, which are influenced by the whole length of the closing loop pipe line and the rate of the heat receiving section. The following will explain the values in more detail. In this case, as a premise, the quality of the pipe material forming the closing loop pipe line is not limited, but it is assumed that there occurs no change by the temperature of the whole volume of the pipe line.

It is defined that V is a whole volume of the closing loop pipe line, Ve is a volume of the pipe line of the heat receiving section 3, and Vl is a liquid volume of the heating medium 10 to be enclosed (amount of enclosing). Assuming that the heating mediums 10 of the heat receiving section 3 are all changed to vapors, the amount of enclosing can be expressed by V - Ve.

However, in consideration of the efficiency of the circulation force, assuming that about 10% of the heating mediums 10 are changed to vapors, the actual amount of enclosing can be expressed by the following equation:

$$\text{Actual Amount of Enclosing} = V - (0.1 \times Ve)$$

Therefore, the disable amount of enclosing Vl can be expressed by the following equation:

$$V - Ve < Vl < V (0.1 \times Ve)$$

The cooling apparatus and the temperature control apparatus relating to the heat transfer apparatus of the present invention are not limited to the above-explained embodiments. Various modifications can be made without departing form the gist of the invention.

As explained above, according to the present invention, there can be provided a heat transfer apparatus, which is represented by a cooling apparatus having a simple structure, in which the arrangement of each structural parts is not limited and no circulation apparatus serving as a mechanical power source such as a pump is required, and a temperature control apparatus using such a cooling apparatus.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A heat transfer apparatus comprising:
 closing loop pipe line means enclosing a predetermined amount of liquid heating medium inside;

a heat receiving section receiving heat from an object to be cooled wherein said object to be cooled includes an electronic part, and transferring heat to said heating medium in said closing loop pipe means;

a radiating section taking heat away from said heating medium in said closing loop pipe means;

a first check valve formed to move said heating medium in a first direction toward said radiating section by a volume expansion generated when at least one part of said heating medium evaporates in said heat receiving section;

a second check valve formed to move said heating medium in only the same direction as said first direction by a volume contraction generated when said heating medium evaporated in said radiating section is cooled;

wherein a diameter of the pipe of said closing loop pipe line means close to said heat receiving section is set to be adjusted to a piston type flow state when said heating medium receives heat and evaporates, and changes to a two phase flow of vapor-liquid; and wherein when the pipe of said closing loop pipe line close to said heat receiving section is horizontally arranged, an inner diameter d (mm) of said pipe is set as follows:

$$d < 150 [x]\sqrt{\sigma/\rho}$$

where $\sigma$: surface tension of the heating medium (N/m), and $\rho$: density of the heating medium (g/cm$^3$).

2. The heat transfer apparatus according to claim 1, wherein a volume of said heating medium is set to be in a range expressed by the following inequality:

$$V - Ve < Vl < V - (0.1 \times Ve)$$

where V: a whole volume of the closing loop pipe line, Ve: a volume of the pipe line of the heat receiving section, and Vl: a whole volume of the heating medium.

3. A heat transfer apparatus comprising:

closing loop pipe line means enclosing a predetermined amount of liquid heating medium inside;

a heat receiving section receiving heat from an object to be cooled wherein said object to be cooled includes an electronic part, and transferring heat to said heating medium in said closing loop pipe means;

a first radiating section taking heat away from said heating medium in said closing loop pipe means;

a heat exchanger for exchanging heat between the heating medium heated in said heat receiving section and the heating medium cooled in said first radiating section;

at least one check valve formed in said closing loop pipe line means and allowing only one way flow of said heating medium from said heat receiving section to said radiating section direction;

wherein when the pipe of said closing loop pipe line close to said heat receiving section is horizontally arranged, an inner diameter d (mm) of said pipe is set as follows:

$$d < 150[x]\sqrt{\sigma/\rho}$$

where $\sigma$: surface tension of the heating medium (N/m), and $\rho$: density of the heating medium (g/cm$^3$).

4. The heat transfer apparatus according to claim 3, wherein a diameter of the pipe of said closing loop pipe line means close to said heat receiving section is set to be adjusted to a piston type flow state when said heating medium receives heat and evaporates, and changes to be a two phase flow of vapor-liquid.

5. The heat transfer apparatus according to claim 3, wherein a volume of said heating medium is set to be in a range expressed by the following inequality:

$$V - Ve < Vl < V - (0.1 \times Ve)$$

where V: a whole volume of the closing loop pipe line, Ve: a volume of the pipe line of the heat receiving section, and Vl: a whole volume of the heating medium.

* * * * *